United States Patent [19]

Hause et al.

[11] Patent Number: 6,013,574

[45] Date of Patent: Jan. 11, 2000

[54] METHOD OF FORMING LOW RESISTANCE CONTACT STRUCTURES IN VIAS ARRANGED BETWEEN TWO LEVELS OF INTERCONNECT LINES

[75] Inventors: Fred N. Hause; Michael J. Gatto, both of Austin, Tex.; Kuang-Yeh Chang, Los Gatos, Calif.

[73] Assignee: Advanced Micro Devices, Inc., Sunnyvale, Calif.

[21] Appl. No.: 08/906,062

[22] Filed: Aug. 5, 1997

Related U.S. Application Data

[63] Continuation of application No. 08/593,856, Jan. 30, 1996, abandoned.

[51] Int. Cl.⁷ .......................... H01L 21/28; H01L 21/31
[52] U.S. Cl. .................. 438/622; 438/625; 438/627; 438/637; 438/714; 438/722; 438/725
[58] Field of Search ................... 438/622, 625, 438/627, 636, 637, 688, 712, 714, 722, 725

[56] References Cited

U.S. PATENT DOCUMENTS

| | | | |
|---|---|---|---|
| 5,057,187 | 10/1991 | Shingawa | 438/725 |
| 5,327,011 | 7/1994 | Iwamatsu | 257/750 |
| 5,354,712 | 10/1994 | Ho et al. | 438/643 |
| 5,420,070 | 5/1995 | Matsuura et al. | 438/625 |
| 5,567,271 | 10/1996 | Chu et al. | 438/712 |

OTHER PUBLICATIONS

"Silicon Processing For The VLSI Era," vol. 1, Process Technology, Wolf, et al., 1986, Chapter 16, pp. 580–581.

*Primary Examiner*—T. N. Quach
*Attorney, Agent, or Firm*—Conley, Rose & Tayon; Robert C. Kowert; Kevin L. Daffer

[57] ABSTRACT

A method of forming low resistance contact structures in vias arranged between interconnect levels is provided. The method involves interconnect lines having an anti-reflective layer formed thereupon. An interlevel dielectric layer is formed over the interconnect lines. A photoresist layer is formed over the interlevel dielectric layer and patterned to define via locations. During via etch, an organic (carbon-based) polymer layer forms upon the anti-reflective-coated interconnect lines at the bottoms of the vias. The photoresist and the etch byproduct polymer layers are then removed using a dry etch process which employs a forming gas comprising nitrogen and hydrogen. A native oxide layer subsequently forms upon the anti-reflective-coated interconnect lines when exposed to oxygen. The native oxide layer is then removed, along with any residual etch byproduct polymer, during a sputter etch procedure. Each resulting via is substantially void of polymer and oxide residue so as to present a clean via area which allows ready adherence of a plug material to the anti-reflective coating.

18 Claims, 4 Drawing Sheets

METHOD OF FORMING LOW RESISTANCE CONTACT STRUCTURES IN VIAS ARRANGED BETWEEN TWO LEVELS OF INTERCONNECT LINES

This application is a continuation, of application Ser. No. 08/593,856, filed Jan. 30, 1996, now abandoned.

BACKGROUND OF THE INVENTION

1. Field of the Invention

This invention relates to integrated circuit manufacture and more particularly to a method of forming low resistance contact structures in vias which are configured between interconnects arranged on two separate topological levels.

2. Description of the Relevant Art

An integrated circuit consists of electronic devices electrically coupled by conductive trace elements, often called interconnect lines (i.e., interconnects). Interconnects are patterned from conductive layers formed on or above the surface of a silicon substrate. One or more conductive layers may be patterned to form one or more levels of interconnects vertically spaced from each other by one or more interlevel dielectric layers. Dielectric-spaced interconnect levels allow formations of densely patterned devices on relatively small surface areas. Interconnects on different levels are commonly coupled electrically using contact structures formed in vias (i.e., holes etched through interlevel dielectric layers separating the interconnects).

The operating speed of an integrated circuit is limited by transistor switching times and signal propagation delays associated with signal lines along one or more critical signal paths through the circuit. A signal line formed between input/output terminals of an integrated circuit comprises interconnects arranged on one or more levels, connected by contact structures (i.e., contacts) disposed between the interconnect levels. Resistance of each signal line is equal to the sum of the resistance values of the interconnect lines and the contacts making up the signal line. As feature sizes shrink, transistor switching times typically decrease while signal propagation delays of signal lines typically increase. In fact, the maximum operating speeds of integrated circuits with submicron feature sizes are typically limited by signal propagation delays associated with signal lines. Thus if the maximum operating speeds of integrated circuits are to increase as device dimensions shrink, the resistance values associated with interconnect lines and contacts must also be reduced to achieve the desired speed.

Following the formation and patterning of an interconnect level, an interlevel dielectric layer is deposited over the interconnect level. Prior to the formation and patterning of a subsequent interconnect level, vias are etched through the interlevel dielectric layer in locations where interconnects on different interconnect levels are to be electrically coupled. Conductive material used to form a layer of interconnects is typically deposited on or above the surface of a silicon substrate by sputter deposition. As long as sputter deposition can adequately fill the vias, special via-filling procedures are not required. However, in order to increase layout densities, advanced submicron fabrication technologies typically require a via-filling operation be incorporated into the process sequence prior to the deposition and patterning of subsequent interconnect levels. Metal via plugs thus formed in via openings constitute contact structures arranged in electrical contact between interconnects on different levels. The via openings are formed through interconnect dielectric layers which, when filled with metallic via plugs, comprise a contact structure.

A layer of photoresist is typically formed on the surface of an interlevel dielectric layer and patterned to define via locations. During via etch, organic material derived from the photoresist layer forms what is believed to be a polymer layer on the exposed upper surfaces of the interconnects at the bottoms of the vias. After the vias have been formed but before the via plug material is deposited, portions of the upper surfaces of interconnects located at the bottoms of the vias are exposed to oxygen in the ambient. A native oxide layer may thus be formed on the exposed upper surfaces of the interconnects at the bottoms of the vias in combination with the polymer layer. Oxide and/or carbon-based polymer materials, both poor conductors of electricity, result in an increase in the electrical resistance of contact structures subsequently formed in the vias. In order to form low resistance contact structures, it is necessary to remove any and all etch byproduct polymer and oxide layers from exposed interconnect surfaces at the bottoms of the vias prior to forming contact structures within the vias.

Resistance values of metal-to-metal contact structures formed using conventional processes may vary considerably. Highly resistive contact structures in critical signal paths of an integrated circuit will deleteriously reduce the maximum operating speed of that circuit. It would thus be advantageous to have a method of forming low resistance contact structures in vias between interconnect lines arranged on different interconnect levels.

SUMMARY OF THE INVENTION

A method of forming low resistance contact structures in vias between interconnect lines arranged on different interconnect levels is presented. A layer of anti-reflective material is deposited over conductive layers subsequently patterned to form interconnects. Anti-reflective layers are used to reduce the reflectance of light which has an adverse affect on photolithographic patterning processes. Interconnect lines thus typically incorporate a layer of an anti-reflective material. Common anti-reflective materials include titanium nitride (TiN), silicon oxynitride (SiON), and amorphous silicon.

An upper topography of a silicon substrate is provided upon which the present process methodology is applied. The upper topology includes (i) an interconnect line formed upon an upper surface of the upper topography, the interconnect line having an anti-reflective layer formed upon an upper surface of the interconnect line, and (ii) an interlevel dielectric layer formed over the interconnect line and the upper surface of the upper topography. The present process broadly includes applying a layer of photoresist over the interlevel dielectric layer. The photoresist layer is patterned and developed to define one or more openings through the photoresist layer. Vias are etched through the interlevel dielectric layer within the confines of the openings in the photoresist layer. During the via etching procedure, a layer of etch byproduct polymer forms on areas of the upper surface of the anti-reflective layer at the bottoms of the vies. The etch byproduct polymer is an organic (carbon-based) material presumably derived from the photoresist material which masks adjacent interlevel dielectric. The remaining portion of the photoresist layer and the etch byproduct polymer layer atop the anti-reflective layer are then removed using a plasma etch process advantageously employing forming gas (about 96% $N_2$ and about 4% $H_2$). An organic solvent rinse may then be used to remove substantially all traces of photoresist and organic polymer residue remaining after the etch process.

Following the via etch procedure, a native oxide layer forms on portions of the upper surface of the anti-reflective layer exposed to oxygen in the ambient. It is believed the native oxide arises from thermal interaction with the exposed anti-reflective material. A sputter etch process is used to remove the native oxide layer, along with any residual etch byproduct polymer. A TiN layer is thereafter deposited over the interlevel dielectric layer, removed of the etch byproduct polymer and oxide. The TiN layer is put forth to improve adhesion of a subsequently deposited tungsten (W) layer. The W layer is deposited over the TiN layer to a thickness so as to substantially fill the vias. Portions of the W and TiN layers over the interlevel dielectric layer are then removed. Remaining portions of the W and TiN layers fill the vias, forming low resistance contact structures (i.e., via plugs) which may be used to electrically couple interconnect lines arranged on different interconnect levels.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
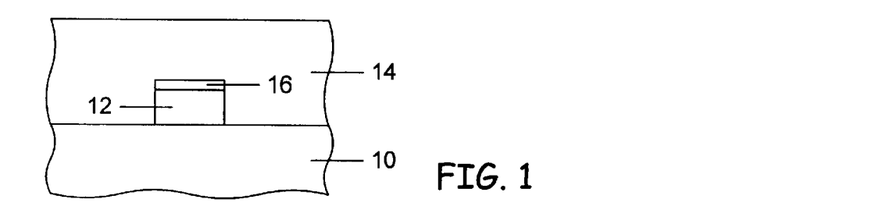
FIG. 1 is a partial cross-sectional view of a silicon substrate topography with an interconnect formed upon the topography, the interconnect having an anti-reflective coating, and wherein an interlevel dielectric layer is formed over the interconnect and the upper surface of the upper topography.

FIGS. 1–11 will be used to describe a beneficial and unique method of forming low resistance contact structures in vias between interconnects. FIG. 1 is a partial cross-sectional view of an upper topography 10 of a silicon substrate. Formed upon upper topography 10 is an interconnect 12, as well as an interlevel dielectric layer 14 which resides over interconnect 12 and upper topography 10. Upper topography 10 may be an upper surface of the silicon substrate, or an exposed surface above a number of alternating dielectric and interconnect layers formed upon an upper surface of the silicon substrate. Interconnect 12 is typically formed from a conductive layer chiefly comprising aluminum. An anti-reflective material is deposited on the upper surface of interconnect 12, forming an anti-reflective layer 16. Anti-reflective layer 16 is deposited prior to interlevel dielectric layer 14 deposition. Common anti-reflective materials include TiN, SiON, and amorphous silicon. Interlevel dielectric layer 14 is preferably an oxide layer.

Figure 2:
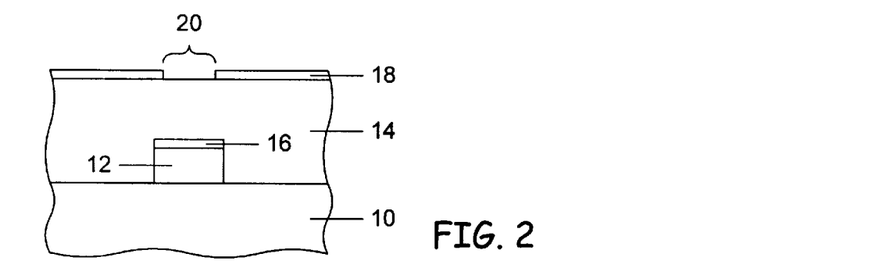
FIG. 2 is a partial cross-sectional view the upper topography following exposure and development of a photoresist layer applied over the interlevel dielectric layer in order to define a via location.

FIG. 2 is a partial cross-sectional view of upper topography 10 following application, exposure, and development of a photoresist layer 18 in order to define via locations. A preferred method of applying photoresist layer 18 to the upper surface of upper topography 10 is by using a spin-coat process. In a photoresist spin-coat process, the silicon substrate is typically held on a vacuum chuck. A sufficient amount of liquid photoresist material is then deposited near the center of the substrate, and allowed to spread out into a puddle. When the puddle reaches a predetermined diameter, the substrate and vacuum chuck are sent into a rotating motion about an axis near the center of and normal to the upper surface of the upper topography. The substrate and vacuum chuck are rapidly accelerated to a predetermined rotational speed. Centrifugal forces spread the photoresist material from the center of the substrate to the substrate edge. Excess photoresist material is thrown off of the edge of the substrate. A substantially even flow of photoresist material is thus achieved across the upper surface of the upper topography of the silicon substrate.

Following photolithographic exposure and development, portions of photoresist layer 18 are removed where vias are to be formed through interlevel dielectric layer 14. In FIG. 2, a portion of photoresist layer 18 is removed over via location 20.

Figure 3:
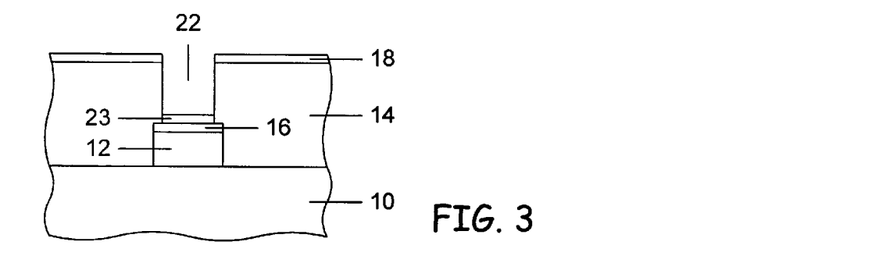
FIG. 3 is a partial cross-sectional view of the upper topography following etch removal of the via location to form a via, an etch byproduct polymer layer having formed on areas of the upper surface of the anti-reflective layer exposed at the bottoms of the vias.

FIG. 3 is a partial cross-sectional view of upper topography 10 following etching removal of portions of interlevel dielectric layer 14 in order to form vias. Via 22 is typically formed using a common dry etch process (e.g., plasma etch). During a plasma etch process, a silicon substrate is placed in a reaction chamber containing one or more reactant gases. A glow discharge (i.e., a plasma) is formed when radio frequency (RF) power is applied between a pair of electrodes within the chamber (planar plasma etching) or to a coil surrounding the chamber (inductively coupled plasma etching). The reactant gases produce chemically reactive species (atoms, ions, and radicals) which diffuse to the surface of the silicon substrate and are adsorbed. A chemical reaction occurs, with the formation of volatile by-products. These by-products are desorbed from the surface and diffuse into the ambient.

A suitable inductively coupled plasma etch process used to etch the vias includes a plurality of steps, some of which are as follows. First, the silicon substrate is placed on a wafer chuck within a reaction chamber. $C_2F_6$ gas is introduced into the reaction chamber at a flow rate of approximately 30 sccm. The pressure within the reaction chamber is suitably maintained at about 5.0 mTorr during the etch process, and RF power of about 2,600 watts is delivered to the coil surrounding the reaction chamber at a frequency of approximately 2.0 MHz. In addition, an RF power of about 1,600 watts is delivered to the wafer chuck at a frequency of approximately 1.8 MHz. The temperature of the silicon substrate is maintained at approximately −10° C. throughout the etch process.

During the via etch procedure, an etch byproduct polymer layer 23 forms on areas of the upper surface of anti-reflective layer 16 exposed at the bottoms of the vias. Etch byproduct layer 23 is an organic (carbon-based) material derived from photoresist layer 18 which masks portions of interlevel dielectric layer 14 surrounding the vias.

Figure 4:
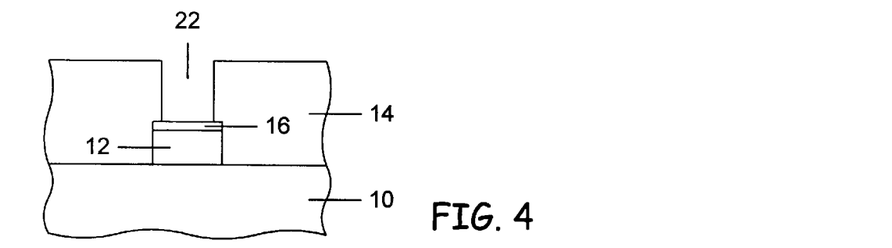
FIG. 4 is a partial cross-sectional view of the upper topography following removal of the remaining portion of the photoresist layer and the etch byproduct polymer layer.

FIG. 4 is a partial cross-sectional view of upper topography 10 following removal of the remaining portion of photoresist layer 18 and the etch byproduct polymer layer 23 on areas of the upper surface of anti-reflective layer 16 exposed at the bottoms of the vias. The process to remove the remaining portion of photoresist layer 18 and the etch byproduct polymer layer 23 may be carried out using a downstream plasma strip process employing forming gas or a plasma etch process employing forming gas. According to an exemplary embodiment, the forming gas used during the plasma etching process is composed of about 96% nitrogen ($N_2$) gas and about 4% hydrogen ($H_2$) gas. A suitable downstream plasma strip process includes a plurality of steps, some of which are as follows. The silicon substrate is placed on a platen within a reaction chamber. Oxygen ($O_2$) gas and forming gas are introduced into the reaction chamber at flow rates of approximately 500 sccm and 3,000 sccm, respectively, forming a flow of reactant gases. Two electrodes are positioned on either side of the flow of reactant gases. RF power of approximately 1,100 watts applied between the two electrodes ionizes the reactant gas molecules as they flow between the electrodes. The platen upon which the silicon substrate is located is positioned downstream of the electrodes, thus the silicon substrate is subjected to a flow of ionized reactant gas molecules. The pressure within the reaction chamber is reduced to and suitably maintained at about 1,400 mTorr during the etch process. The temperature of the silicon substrate is maintained at about 240° C. during the strip process.

Forming gas is advantageously employed during the etching removal of the remaining portion of photoresist layer 18 in order to remove the etch byproduct polymer layer 23 formed over areas of the upper surface of anti-reflective layer 16 exposed at the bottoms of the vias. Without being bound to theory, it is postulated that the $H_2$ in the forming gas combines with carbon atoms in etch byproduct polymer layer 23 on exposed surfaces of interconnects arranged in the bottoms of the vias. For example, if etch byproduct polymer layer 23 is represented by R-C-R, the $H_2$ in the forming gas may remove this etch byproduct polymer according to the following two step reaction sequence:

$$R\text{-}C\text{-}R + H_2 \rightarrow R\text{-}H + H\text{-}C\text{-}R$$

$$H\text{-}C\text{-}R + O_2 \rightarrow CO_2 + H\text{-}R$$

The $CO_2$ and H-R molecules are expelled from the bottoms of the vias and into the etch chamber, then removed from the etch chamber along with other etch byproducts.

An organic solvent rinse may be carried out following the removal of photoresist layer 18 and the etch byproduct polymer layer 23. The organic solvent rinse may be accomplished by spraying an organic photoresist solvent on the upper surface of the upper topography, or by immersing the silicon substrate in an organic photoresist solvent. An isopropyl alcohol rinse may then be used to remove traces of the organic solvent.

Figure 5:
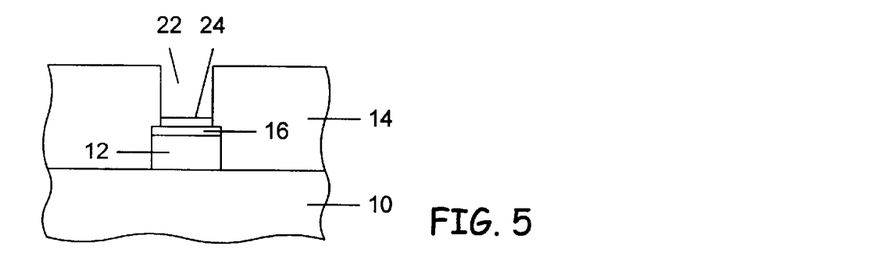
FIG. 5 is a partial cross-sectional view of the upper topography following formation of a native oxide upon the anti-reflective layer exposed surface.

FIG. 5 is a partial cross-sectional view of the upper topography following the photoresist/polymer removal procedure. A native oxide layer 24 grows upon the portions of anti-reflective layer 16 at the bottoms of the vias when exposed to oxygen in the air. For example, if anti-reflective layer 16 comprises TiN, native oxide layer 24 may comprise TiON. If anti-reflective layer 16 comprises SiON, then silicon within SiON will combine with oxygen ambient to form $SiO_x$, where x is preferably near 2.0.

Figure 6:
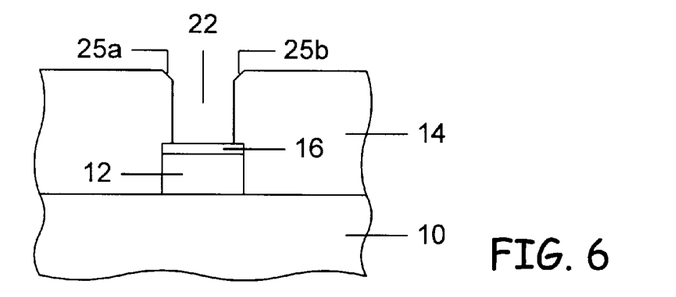
FIG. 6 is a partial cross-sectional view of the upper topography following sputter etching of the areas of the upper surface of the anti-reflective layer exposed at the bottoms of the vias in order to remove the native oxide layer.

As oxides are electrical insulating materials, failure to remove substantially all of native oxide layer 24 will result in increased resistance values of subsequently formed contact structures. FIG. 6 is a partial cross-sectional view of the upper topography 10 following sputter etching of the areas of the upper surface of anti-reflective layer 16 exposed at the bottoms of the vias in order to remove native oxide layer 24. The sputter etch procedure also removes any etch byproduct polymer remaining on the upper surface of anti-reflective layer 16 at the bottoms of the vias. The sputter etch procedure is thus advantageously combined with the preceding photoresist/polymer removal procedure employing forming gas to reduce resistance values of contact structures formed in the vias.

During a sputter etching procedure, a silicon substrate is placed on an electrically grounded holder within a vacuum chamber. The pressure within the vacuum chamber is reduced, and a flow of argon (Ar) gas is introduced into the chamber. The flow of Ar gas is subjected to a stream of high-energy electrons between charged electrodes within the vacuum chamber, producing a flow of ionized Ar atoms with a positive electrical charge. Attracted to the more negatively charged silicon substrate, the ionized Ar atoms accelerate toward and eventually impact upon the exposed upper surface of the silicon substrate. As the energetic Ar atoms impact the upper surface of the silicon substrate, they dislodge small amounts of material from the upper surface through the physical process of mass transfer.

The sputter etching process of the present invention thus involves placing upper topography 10 within a vacuum chamber, lowering the pressure within the chamber, and subjecting an exposed upper surface to a flow of ionized Ar atoms within the vacuum chamber. Impacting at angles approximately normal to the exposed upper surface, the Ar ions are able to remove material from areas of the upper surface of anti-reflective layer 16 exposed at the bottoms of the vias, including the native oxide layer 24 upon anti-reflective layer 16. The sputter etch process also removes corners 25a and 25b of interlevel dielectric layer 14 as shown in FIG. 6. As will be discussed below in conjunction with FIG. 10, the sputter etch process is preferably carried out until about 200 angstroms of material is removed from the upper surface of anti-reflective layer 16 over interconnect 12 at the bottom of via 22.

Figure 7:
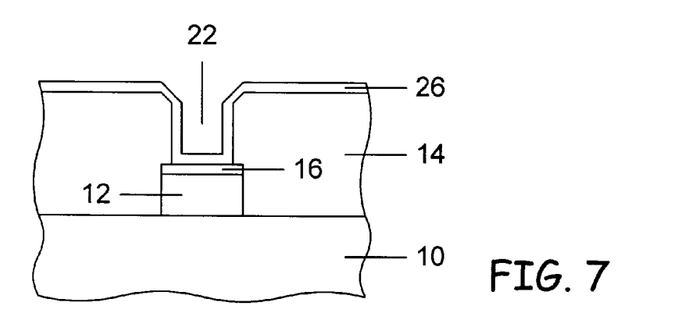
FIG. 7 is a partial cross-sectional view of the upper topography following formation of a TiN layer over the interlevel dielectric layer in order to improve the adhesion of a subsequently deposited W layer.

FIG. 7 is a partial cross-sectional view of upper topography 10 following formation of a TiN layer 26 over interlayer dielectric layer 14 in order to improve the adhesion of a subsequently deposited W layer. Such adhesion layers are required due to the extremely poor adhesion of W to oxide interlevel dielectric layers. TiN layer 26 may be deposited using common evaporation, sputtering, or chemical vapor deposition (CVD) processes.

A suitable sputter deposition process involves placing upper topography 10 within an evacuated reaction chamber containing a source of positively charged ions and a TiN target maintained at a negative electrical potential relative to the ion charge. The positively charged ions, having sufficient energy to dislodge atoms from the TiN target, are directed at the TiN target. Dislodged (i.e., sputtered) TiN atoms settle on everything in the reaction chamber, including upper topography 10. The TiN atoms which settle on upper topography 10 then condense to form TiN layer 26. TiN layer 26 is deposited to a thickness necessary to enhance adhesion of a subsequently formed tungsten layer. The thickness of TiN layer 26 is chosen such that it conformally coats the upper surface of interlevel dielectric layer 14 and the sides and bottom of via 22 as shown in FIG. 7.

Figure 8:
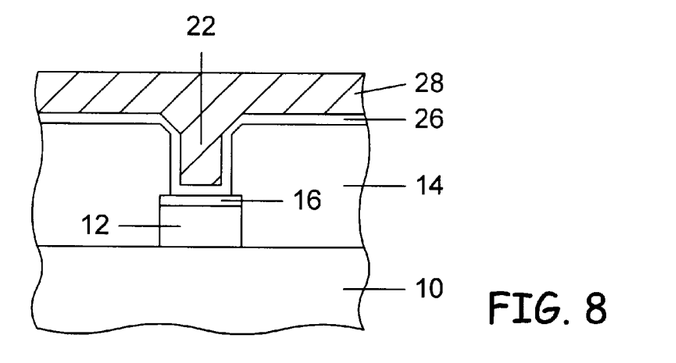
FIG. 8 is a partial cross-sectional view of the upper topography following formation of a W layer over the TiN layer.

A layer of W is then deposited over the TiN layer. FIG. 8 is a partial cross-sectional view of upper topography 10 following formation of a W layer 28 over TiN layer 26. A suitable CVD process involves placing upper topography 10 in a CVD reaction chamber containing tungsten hexafluoride ($WF_6$) and hydrogen ($H_2$), increasing the temperature inside the reaction chamber to between 350° C.–450° C., and reducing the pressure inside the reaction chamber. A layer of W is thus formed according to the following reaction:

$$WF_6 + 3H_2 \rightarrow W + 6HF$$

W layer 28 is deposited to a thickness so as to substantially fill via 22.

Figure 9:
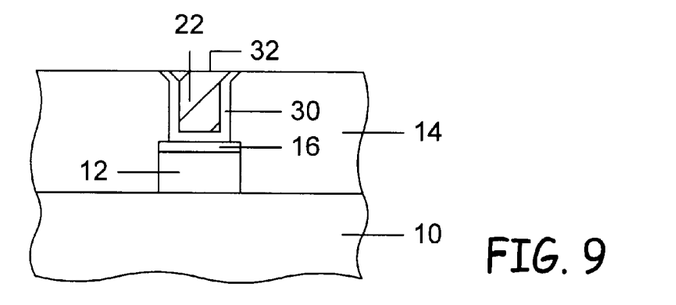
FIG. 9 is a partial cross-sectional view of the upper topography following removal of portions of the W and TiN layers over the interlevel dielectric layer, illustrating how remaining portions of the W and TiN layers substantially fill a via to form a contact structure (i.e., a via plug)

Portions of W layer 28 and TiN layer 26 are then removed from the surface of interlevel dielectric layer 14. Removal of the portions of the W and TiN layers over the interlevel dielectric layer is preferably accomplished using a chemical-mechanical polish (CMP) operation. Alternately, the W and TiN layers may be removed using an etching process.

During a suitable CMP process, the silicon substrate is held on a vacuum chuck of a CMP tool. A polishing pad of the CMP tool, saturated with an abrasive slurry solution, is pressed against the exposed upper surface of upper topography 10. The polishing pad and the vacuum chuck are then caused to rotate in opposite directions by an electrical motor. Features on the upper surface of upper topography 10 are removed by polishing via movement of the polishing pad relative to the upper surface of upper topography 10.

FIG. 9 is a partial cross-sectional view of upper topography 10 following removal of portions of W layer 28 and TiN layer 26, illustrating how remaining portion 32 of W layer 28 and remaining portion 30 of TiN layer 26 fill via 22 to form a contact structure (i.e., a via plug). The resulting low resistance contact structure may be used to electrically couple interconnect line 12 to an interconnect line on a subsequently formed interconnect level.

Figure 10:
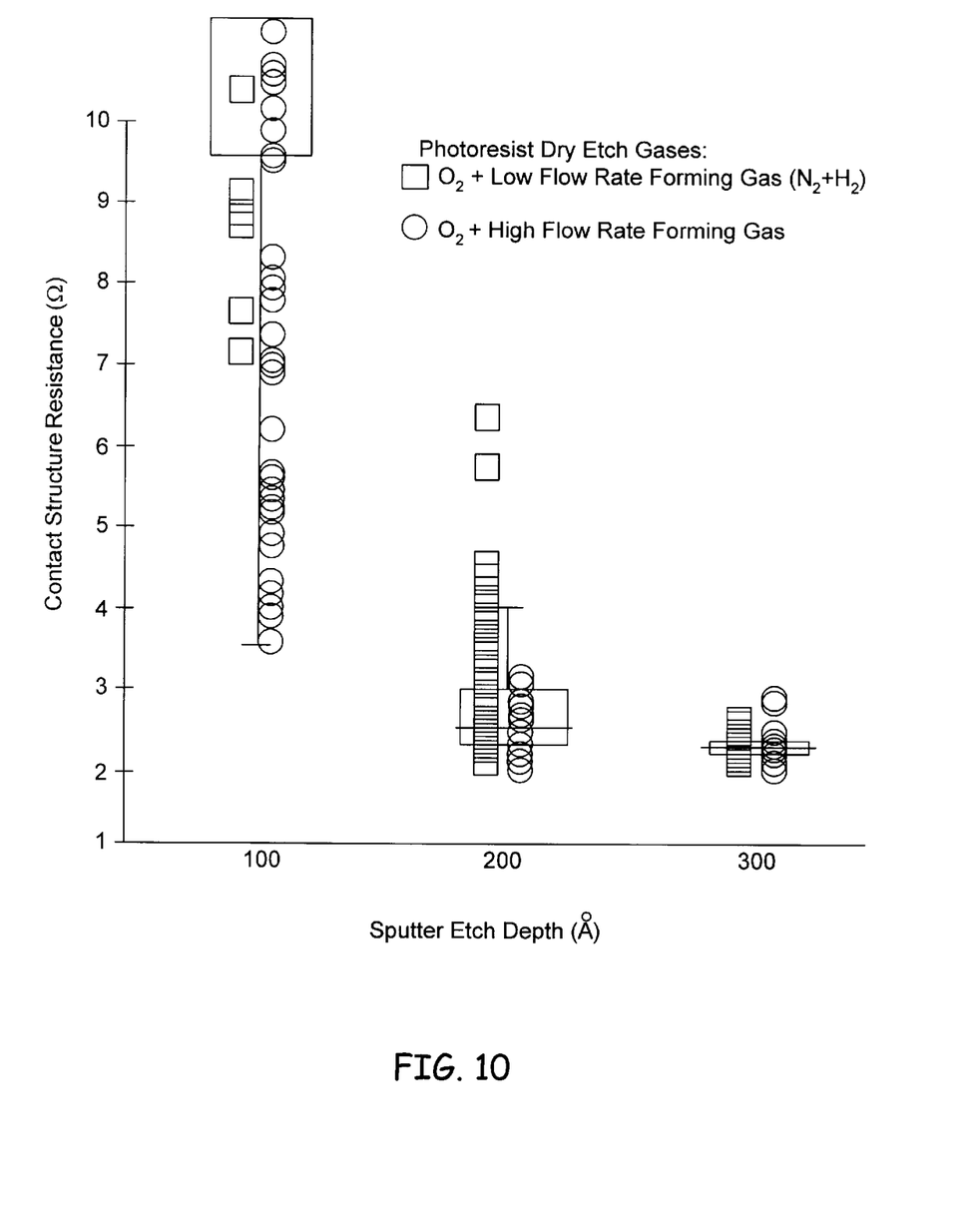
FIG. 10 is a graph of contact structure resistance versus sputter etch depth for experimental samples produced using processes which included a photoresist dry etch procedure employing (i) $O_2$ and a low flow rate of forming gas (about 96% $N_2$ and about 4% $H_2$), and (ii) $O_2$ and a high flow rate of forming gas.

FIG. 10 is a graph of contact structure resistance values versus sputter etch depth obtained from an experiment involving the formation of test contact structures within vias. Two sets of vias and associated contact structures were formed as described above, with photoresist/polymer etch parameters and sputter etch removal depths varied during the formation of the vias in order to determine an optimal method for removing both etch byproduct polymer and native oxide from coated interconnect lines. During the step of removing the remaining photoresist layer and the etch byproduct polymer layer, a first set of test vias was subjected to oxygen and forming gas flow rates of 2,000 and 200 sccm, respectively, in a downstream plasma strip process. A second set of test vias was subjected to oxygen and forming gas flow rates of 500 and 3,000 sccm, respectively, during a similar downstream plasma strip process. Thus vias in the first set were subjected to a relatively low flow rate of forming gas during the photoresist/polymer removal procedure, and vias in the second set were subjected to a relatively high flow rate of forming gas. Following the photoresist/polymer removal procedure, vias from each of the two sets were subjected to sputter etching at depths of 100, 200, and 300 angstroms to remove native oxide formed on the coated interconnect lines at the bottoms of the vias.

At sputter etch depths of 100 angstroms, contact structures formed in both sets of test vias displayed relatively high resistance values which varied considerably. At sputter etch depths of 200 angstroms, however, contact structures formed in vias from the second set of test vias displayed low resistance values with little variation. The first set of test vias produced contact structures with slightly lower resistance values at the 200 angstrom sputter etch depth, but the resistance values were still relatively high and varied considerably. At sputter etch depths of 300 angstroms, contact structures formed in vias from the both sets of test vias displayed comparably low resistance values and little variations in resistance values.

A native oxide layer typically grows to a depth of less than 100 angstroms on planar surfaces of common semiconductor materials. Removal of more than 100 angstroms of material from the upper surfaces of coated interconnect lines may be required during the sputter etch procedure due to the fact that the upper surfaces of the coated interconnect lines are uneven. The anti-reflective coating may have grain boundaries which produce an uneven surface, or the surface of the anti-reflective coating may be roughened during the via etch procedure. In addition, residual etch byproduct polymer may remain in crevices or valleys on the upper surfaces of the coated interconnects following the photoresist/polymer removal procedure. Sputter etching may be less effective on the residual polymer than on the native oxide layer, and the residual polymer may act as a barrier to complete oxide removal. Thus it may be necessary to sputter etch to a depth greater than 100 angstroms in order to remove sufficient quantities of residual polymer and native oxide in order to form low resistance contact structures between coated interconnect lines on different interconnect levels.

As described above, sputter etching involves ionic bombardment of a semiconductor substrate. Subjecting a semiconductor substrate with metal oxide semiconductor (MOS) transistors formed thereon to ionic bombardment causes charges to build up on conductive surfaces, possibly resulting in the formation of electron traps in gate oxides. These electron traps may cause shifts in the threshold voltages of associated MOS transistors. If charge accumulation results in voltages across gate oxides which exceed breakdown voltages, the gate oxides may be destroyed. Sputter etch time is thus preferably kept as short as possible to reduce charge buildup on conductive surfaces. Since sputter etch depth is dependent on sputter etch time, sputter etch depth is preferably kept as small as possible.

Although it is possible to form low resistance contact structures using sputter etch depths of 300 angstroms even when a low forming gas flow rate is used during the photoresist/polymer removal operation, it is preferable to use a high forming gas flow rate to reduce the required sputter time and depth during the subsequent sputter etch procedure. Thus the optimum method for removing both etch byproduct polymer and native oxide from coated interconnect lines in the bottoms of vias is to use a forming gas flow rate in excess of 3,000 sccm during the photoresist/polymer removal procedure, and to carry out the sputter etch removal procedure for a time period required to remove about 200 angstroms of material from the upper surface of coated interconnects at the bottoms of vias.

Figure 11:
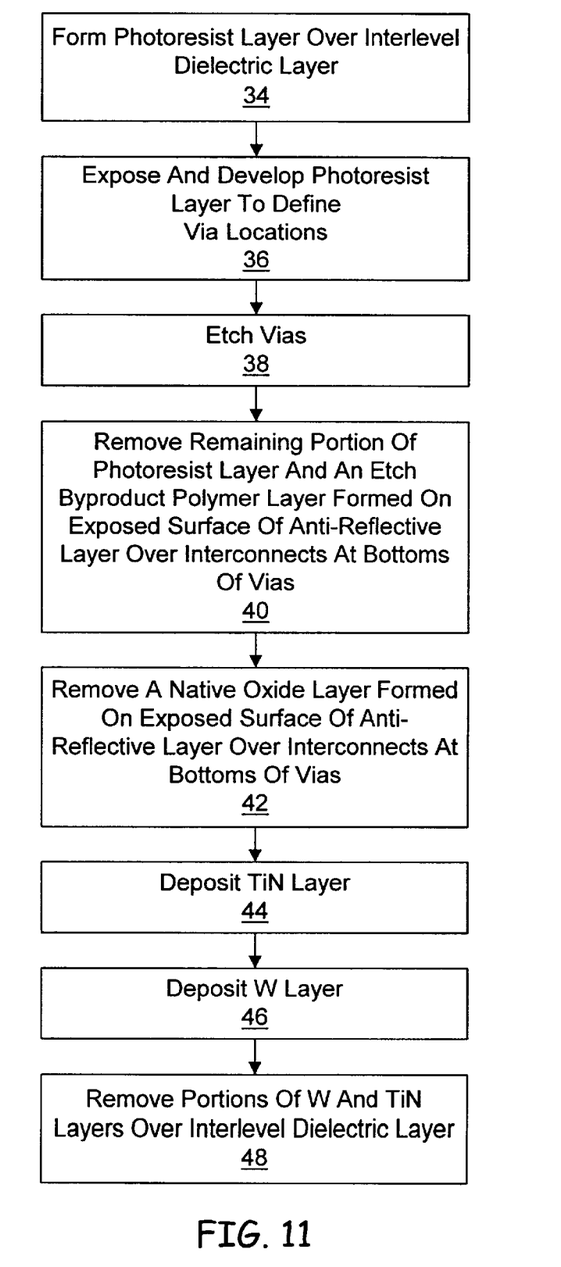
FIG. 11 is a flowchart of the method of forming low resistance contact structures in vias between interconnect lines arranged on different interconnect levels.

FIG. 11 is a flowchart of the method of forming low resistance contact structures in vias between interconnect lines. This flowchart may be used to summarize the method. During a first step 34, a layer of photoresist is applied over an interlevel dielectric layer. The interlevel dielectric layer is formed over an interconnect, with an anti-reflective layer of TiN, on an upper surface of an upper topography of a silicon substrate. The photoresist layer is exposed and developed to define via locations during a step 36. Portions of the photoresist layer are removed over regions where vias will be etched through the interlevel dielectric layer. During a step 38, the vias are etched through the interlevel dielectric layer. A common dry etch process (e.g., plasma etch) may be used to etch the vias. During the via etch procedure, an etch byproduct polymer layer forms on areas of the upper surface of the anti-reflective layer exposed at the bottoms of vias. The remaining portion of the photoresist layer and the etch byproduct polymer layer are removed using a plasma etch process employing forming gas (about 96% $N_2$ and about 4% $H_2$) during a step 40. The plasma etch process may then be followed by an organic solvent rinse to remove any photoresist residue remaining after the plasma etch. Following the photoresist/polymer removal step, a native oxide layer grows on the area of the upper surface of the anti-reflective layer exposed to oxygen in the ambient. During a step 42, the native oxide layer is sputter removed from exposed areas of the upper surface of the anti-reflective layer, along with any residual etch byproduct polymer. Substantially all of the etch byproduct polymer layer and native oxide are removed in order to reduce the resistance values of contact structures formed in the vias. A TiN layer is deposited over the exposed upper surface of the silicon substrate in a step 44. The TiN layer conformally covers the interlevel dielectric layer as well as the sides and bottoms of the vias, improving the adhesion of a subsequently deposited W layer. During a step 46, a W layer is deposited over the TiN layer. The W layer is deposited to a thickness so as to substantially fill the vias. Portions of the W and TiN layers over the interlevel dielectric layer are removed during a final step 48. Removal of the portions of the W and TiN layers over the interlevel dielectric layer is preferably accomplished using a chemical-mechanical polish (CMP) operation. Alternately, the W and TiN layers may be removed using an etching process. Following step 48, remaining portions of the W and TiN layers fill the vias to form contact structures (i.e., via plugs). The resulting low resistance contact structures may be used to electrically couple interconnect lines arranged on different interconnect levels.

It will be appreciated by those skilled in the art having the benefit of this disclosure that this invention is believed to be capable of forming low resistance contact structures in vias between interconnect lines arranged on different interconnect levels. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of forming an opening through an interlevel dielectric to an underlying interconnect line, comprising:

providing a coated interconnect line extending partially across an upper topography of a silicon substrate, and further providing an interlevel dielectric across said interconnect line and said upper topography;

applying a photoresist layer across said interlevel dielectric;

selectively removing said photoresist layer and underlying said interlevel dielectric to expose a portion of the coated interconnect line;

plasma etch removing an etch byproduct polymer formed upon the exposed said portion of the coated interconnect line; and sputter etch removing a native oxide layer formed upon the exposed said portion of the coated interconnect line for a time period required to remove approximately 200 angstroms or more of said native oxide layer.

2. The method as recited in claim 1, further comprising:

depositing a layer of titanium nitride (TiN) upon the exposed said portion of coated interconnect line;

depositing a layer of tungsten (W) upon the layer of titanium nitride;

removing both W and TiN layers to an elevational level substantially equal to an upper surface of said interlevel dielectric.

3. The method as recited in claim 2, wherein the step of removing the W and TiN layers comprises chemical-mechanical polishing.

4. The method as recited in claim 2, wherein removing W and TiN layers comprise plasma etch removing.

5. The method as recited in claim 2, wherein removing W and TiN layers comprise plasma etch removing said layers to an upper surface having an elevational level substantially equal to said interlevel dielectric.

6. The method as recited in claim 1, wherein said photoresist layer is applied using a spin-coat method.

7. The method as recited in claim 1, wherein selectively removing said interlevel dielectric comprises inserting the silicon substrate into a reaction chamber containing a reactant gas comprising carbon and fluorine.

8. The method as recited in claim 7, wherein the reactant gas comprises $C_2F_6$.

9. The method as recited in claim 7, wherein the silicon substrate is inserted between a pair of charged electrodes arranged within the reaction chamber pressurized at less than atmospheric pressure.

10. The method as recited in claim 1, wherein said plasma etch removing comprises exposing the silicon substrate to oxygen and forming gases which form a flow of reactant gases.

11. The method as recited in claim 10, wherein said exposing the silicon substrate comprises inserting the silicon substrate between a pair of electrodes arranged within an evacuated reaction chamber.

12. The method as recited in claim 1, wherein said plasma etch removing an etch byproduct polymer comprises inserting the silicon substrate between a pair of charged electrodes arranged in an ambient comprising nitrogen and hydrogen gases.

13. The method as recited in claim 1, wherein the interconnect line is coated with a layer of TiN.

14. A method for forming a low resistance contact structure, comprising:
   providing an interlevel dielectric upon an interconnect line which extends across a semiconductor topography;
   allowing a polymer to form upon the interconnect line while removing the interlevel dielectric directly above at least a portion of said interconnect line;
   removing the polymer using a plasma with a flow rate sufficient to expose said interconnect line to an oxide forming ambient; and
   removing an oxide from the interconnect line resulting from the oxide forming ambient to again expose said interconnect line, and thereafter depositing a plug material upon the again exposed said interconnect line to form a contact structure substantially void of polymer and oxide, wherein said removing the polymer comprises subjecting the polymer to a forming gas comprising nitrogen and hydrogen at a flow rate approximately equal to or exceeding 3000 sccm, and said removing an oxide comprises subjecting the oxide to a sputter etch for a time period required to remove at least 200 angstroms of oxide.

15. The method as recited in claim 14, wherein said removing the polymer further comprises flowing the forming gas between a pair of charged electrodes.

16. The method as recited in claim 14, wherein the forming gas comprises approximately 96% nitrogen ($N_2$) and approximately 4% hydrogen ($H_2$).

17. A method of forming an opening through an interlevel dielectric to an underlying interconnect line, comprising:
   providing a coated interconnect line extending partially across an upper topography of a silicon substrate, and further providing an interlevel dielectric across said interconnect line and said upper topography;
   applying a photoresist layer across said interlevel dielectric;
   selectively removing said photoresist layer and underlying said interlevel dielectric to expose a portion of the coated interconnect line;
   plasma etch removing an etch byproduct polymer formed upon the exposed said portion of the coated interconnect line, wherein said plasma etch removing comprises flowing a forming gas into a plasma chamber at a flow rate approximately equal to or exceeding 3000 sccm; and
   sputter etch removing a native oxide layer formed upon the exposed said portion of the coated interconnect line.

18. A method of forming an opening through an interlevel dielectric to an underlying interconnect line, comprising:
   providing a coated interconnect line extending partially across an upper topography of a silicon substrate, and further providing an interlevel dielectric across said interconnect line and said upper topography;
   applying a photoresist layer across said interlevel dielectric;
   selectively removing said photoresist layer and underlying said interlevel dielectric to expose a portion of the coated interconnect line;
   plasma etch removing an etch byproduct polymer formed upon the exposed said portion of the coated interconnect line, wherein said plasma etch removing comprises flowing a forming gas into a plasma chamber, wherein the forming gas comprises approximately 96% nitrogen ($N_2$) and approximately 4% hydrogen ($H_2$); and
   sputter etch removing a native oxide layer formed upon the exposed said portion of the coated interconnect line.

* * * * *